(12) United States Patent
Lee

(10) Patent No.: US 11,843,374 B2
(45) Date of Patent: Dec. 12, 2023

(54) LEVEL SHIFTER

(71) Applicant: SK hynix Inc., Gyeonggi-do (KR)

(72) Inventor: Seung Ho Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/830,056

(22) Filed: Jun. 1, 2022

(65) Prior Publication Data

US 2023/0231558 A1 Jul. 20, 2023

(30) Foreign Application Priority Data

Jan. 20, 2022 (KR) .................. 10-2022-0008807

(51) Int. Cl.
| | | |
|---|---|---|
| *H03K 19/00* | (2006.01) | |
| *H03K 19/0185* | (2006.01) | |
| *H03K 3/356* | (2006.01) | |
| *H03K 19/003* | (2006.01) | |

(52) U.S. Cl.
CPC ........... *H03K 19/018521* (2013.01); *H03K 3/356113* (2013.01); *H03K 3/356182* (2013.01); *H03K 19/0013* (2013.01); *H03K 19/00315* (2013.01); *H03K 19/018571* (2013.01)

(58) Field of Classification Search
CPC ... H03K 19/018571; H03K 19/018521; H03K 19/0013; H03K 19/00315; H03K 3/356113; H03K 3/356182
See application file for complete search history.

(56) References Cited

U.S. PATENT DOCUMENTS

| | | | | |
|---|---|---|---|---|
| 5,821,800 A | * | 10/1998 | Le ................... | H03K 17/102 |
| | | | | 327/437 |
| 6,099,100 A | * | 8/2000 | Lee .................. | H03K 17/102 |
| | | | | 326/83 |
| 7,501,856 B2 | | 3/2009 | Huang | |
| 7,768,308 B2 | * | 8/2010 | Maede .............. | H03K 3/356113 |
| | | | | 327/333 |
| 8,368,425 B2 | * | 2/2013 | Huang ............. | H03K 3/356182 |
| | | | | 327/333 |
| 8,653,878 B2 | * | 2/2014 | Po .................... | H03K 19/0175 |
| | | | | 327/333 |
| 9,755,621 B1 | * | 9/2017 | Sinha ............... | H03K 3/356113 |
| 10,115,450 B1 | * | 10/2018 | DeBrosse ........ | H03K 3/356182 |
| 11,152,941 B2 | * | 10/2021 | Shubin ............. | H03K 19/00 |
| 11,277,121 B1 | * | 3/2022 | Goyal .............. | H03K 3/356113 |
| 2005/0275444 A1 | * | 12/2005 | Khan ................ | H03F 3/45183 |
| | | | | 327/333 |

FOREIGN PATENT DOCUMENTS

KR 10-2017-0006910 A 1/2017

* cited by examiner

*Primary Examiner* — Tuan T Lam
(74) *Attorney, Agent, or Firm* — IP & T GROUP LLP

(57) ABSTRACT

A level shifter may include: a discharge circuit configured to receive an input signal on the basis of a first power supply voltage, and discharge an internal node on the basis of the input signal; a charge supply circuit configured to supply charge to an output node from which an output signal is outputted, on the basis of a second power supply voltage; and a voltage adjustment circuit including a first MOS transistor coupled between the internal node and the output node, and configured to adjust the voltage of the output node on the basis of a bias voltage applied to the first MOS transistor, and stop the operation of adjusting the voltage of the output node on the basis of the bias voltage, when the levels of the first and second power supply voltages are equal to each other.

20 Claims, 7 Drawing Sheets

FIG. 2

| | |
|---|---|
| VCCQ1 | 1.8(V) |
| VCCQ2 | 3.3(V) |
| VSS | 0(V) |
| Vbias | 1.38(V) |
| Vdet | 0(V) |

TABLE A

| | |
|---|---|
| VCCQ1 | 1.8(V) |
| VCCQ2 | 1.8(V) |
| VSS | 0(V) |
| Vbias | 1.8(V) |
| Vdet | 1.8(V) |

TABLE B

LEVEL SHIFTER

CROSS-REFERENCES TO RELATED APPLICATIONS

The present application claims priority under 35 U.S.C. § 119(a) to Korean patent application number 10-2022-0008807, filed on Jan. 20, 2022, the entire disclosure of which is incorporated herein by reference in its entirety.

BACKGROUND

The present disclosure relates to a level shifter.

A level shifter includes a plurality of transistors and performs an operation of adjusting the voltage level of an input signal. Among the transistors, a MOS transistor may be degraded by HCI (Hot Carrier Injection), TDDB (Time Dependent Dielectric Breakdown) or BTI (Bias Temperature Instability).

SUMMARY

Various embodiments of the present disclosure are directed to a level shifter.

In an embodiment of the present disclosure, a level shifter may include: a discharge circuit configured to receive an input signal on the basis of a first power supply voltage, and discharge an internal node on the basis of the input signal; a charge supply circuit configured to supply charge to an output node from which an output signal is outputted, on the basis of a second power supply voltage; and a voltage adjustment circuit including a first MOS transistor coupled between the internal node and the output node, and configured to adjust the voltage of the output node on the basis of a bias voltage applied to the first MOS transistor, and stop the operation of adjusting the voltage of the output node on the basis of the bias voltage, when the levels of the first and second power supply voltages are equal to each other.

In another embodiment of the present disclosure, a level shifter may include: a discharge circuit configured to receive an input signal on the basis of a first power supply voltage, and discharge the charge of an internal node on the basis of the input signal; a charge supply circuit configured to supply charge to an output node from which an output signal is outputted, on the basis of a second power supply voltage; and a voltage adjustment circuit including a first MOS transistor coupled between the internal node and the output node, and configured to detect the voltage of one terminal of the first MOS transistor coupled to the output node, and adjust the voltage of a gate terminal of the first MOS transistor.

In accordance with embodiments of the present disclosure, the level shifter may receive the bias voltage and adjust the lower limit for the voltage level of an output node from which an output signal is outputted, thereby alleviating the degradation of a MOS transistor connected to the output node.

Furthermore, in accordance with embodiments of the present disclosure, the level shifter may continuously supply the compensation current to the output node to compensate for the leakage current of the MOS transistor which adjusts the lower limit for the voltage level of the output node on the basis of the bias voltage, thereby alleviating a variation in the lower limit for the voltage level of the output node by the leakage current.

Furthermore, in accordance with embodiments of the present disclosure, when power supply voltages having the same level are applied to the level shifter, the level shifter may stop the operation of adjusting the lower limit for the voltage level of the output node on the basis of the bias voltage. Thus, the level shifter may stably buffer an input signal, and output the buffered signal as an output signal.

Furthermore, in accordance with embodiments of the present disclosure, the level shifter may adjust the voltage level applied to the gate terminal of a MOS transistor according to the voltage of one terminal of the MOS transistor, from which charge of the output node is released, thereby alleviating the degradation of the MOS transistor.

Furthermore, in accordance with embodiments of the present disclosure, the level shifter may first block the channel, through which charge is supplied to the output node, through the circuit for detecting the voltage of the input signal, before the channel through which the charge of the output node is released is formed according to the voltage of the input signal, thereby improving the duty ratio of the output signal outputted from the output node.

BRIEF DESCRIPTION OF THE DRAWINGS

FIG. 2 is a table for describing the levels of voltages applied to the level shifter illustrated in FIG. 1 in accordance with an embodiment of the present disclosure.

DETAILED DESCRIPTION

In the descriptions of the following examples, the term "preset" indicates that the value of a parameter is previously decided, when the parameter is used in a process or algorithm. According to an example, the value of the parameter may be set when the process or algorithm is started or while the process or algorithm is performed.

Terms such as "first" and "second", which are used to distinguish among various components, are not limited by the components. For example, a first component may be referred to as a second component, and vice versa.

When one component is referred to as being "coupled" or "connected" to another component, it may indicate that the components may be directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having a "logic high level" is distinguished from a signal having a "logic low level." For example, when a signal having a first voltage corresponds to a "logic high level," a signal having a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the teachings of the present disclosure will be described in more detail with reference to the embodiments of the present disclosure. The embodiments are only used to illustrate the teachings of the present disclosure, and the scope of the present disclosure is not limited by the embodiments.

Figure 1:
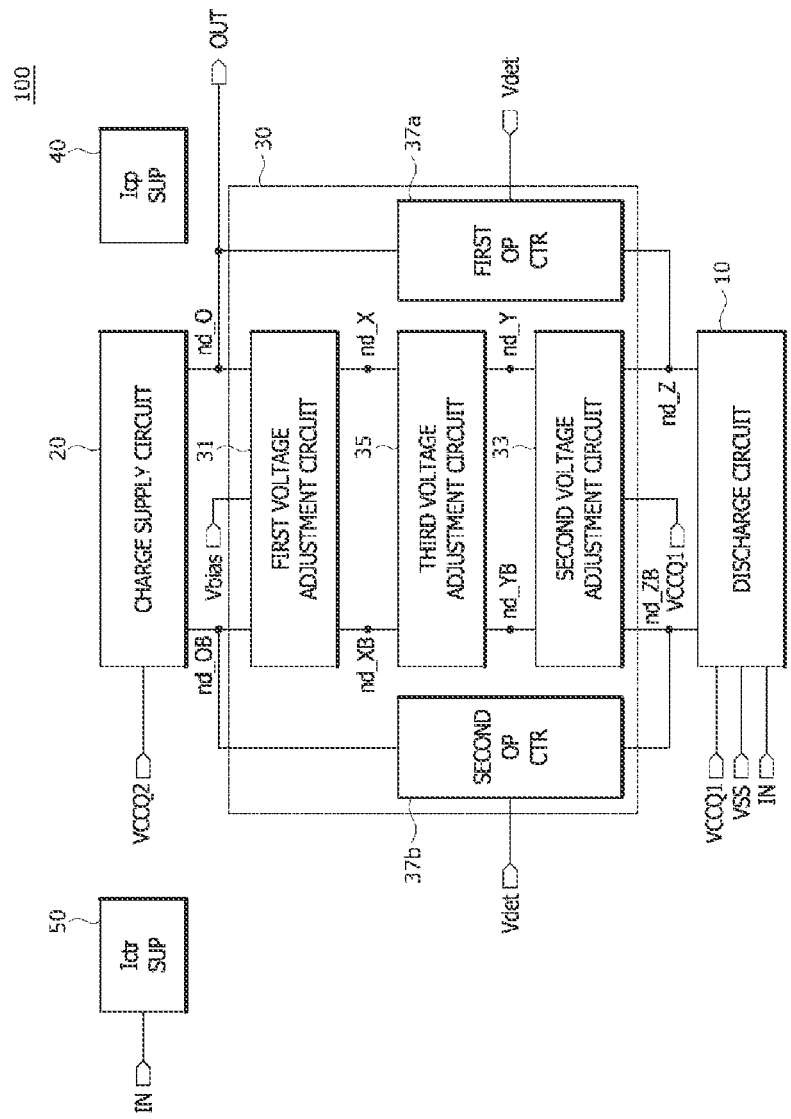
FIG. 1 is a block diagram illustrating the configuration of a level shifter in accordance with an embodiment of the present disclosure.

FIG. 1 is a block diagram illustrating the configuration of a level shifter 100 in accordance with an embodiment of the present disclosure. As illustrated in FIG. 1, the level shifter 100 may include a discharge circuit 10, a charge supply circuit 20, a voltage adjustment circuit 30, a compensation current supply circuit (Icp SUP) 40, and a control current supply circuit (Ictr SUP) 50. The level shifter 100 may include a plurality of MOS transistors.

The level shifter 100 may adjust the voltage level of an input signal IN on the basis of a first power supply voltage VCCQ1, a second power supply voltage VCCQ2, a bias voltage Vbias, a detection voltage Vdet, and a ground voltage VSS, and output the adjusted signal as an output signal OUT. The level of the input signal IN may be set between the levels of the first power supply voltage VCCQ1 and the ground voltage VSS. The level of the output signal OUT may be set between the levels of the second power supply voltage VCCQ2 and the ground voltage VSS. In an embodiment, the level of the second power supply voltage VCCQ2 may be set to the same level as the level of the first power supply voltage VCCQ1, or set to a higher level than the level of the first power supply voltage VCCQ1. The level of the bias voltage Vbias may be set between the levels of the first power supply voltage VCCQ1 and the ground voltage VSS. The level of the detection voltage Vdet may be set differently depending on whether the levels of the first and second power supply voltages VCCQ1 and VCCQ2 are equal to each other.

The level shifter 100 may discharge nodes nd_OB, nd_XB, nd_YB, and nd_ZB to a terminal of the ground voltage VSS, or discharge nodes nd_O, nd_X, nd_Y, and nd_Z to the terminal of the ground voltage VSS, according to the voltage of the input signal IN. When the nodes nd_OB, nd_XB, nd_YB, and nd_ZB are discharged, the level shifter 100 may supply charge from the terminal of the second power supply voltage VCCQ2 to the nodes nd_O, nd_X, nd_Y, and nd_Z. On the other hand, when the nodes nd_O, nd_X, nd_Y, and nd_Z are discharged, the level shifter 100 may supply charge from the terminal of the second power supply voltage VCCQ2 to the nodes nd_OB, nd_XB, nd_YB, and nd_ZB.

The discharge circuit 10 may receive the input signal IN on the basis of the first power supply voltage VCCQ1 and the ground voltage VSS, and discharge one of the internal node nd_Z and the inverting internal node nd_ZB to the terminal of the ground voltage VSS according to the voltage of the input signal IN.

The charge supply circuit 20 may supply charge to the output node nd_O and the inverting output node nd_OB on the basis of the second power supply voltage VCCQ2. The output node may be set to a node from which the output signal OUT is outputted. More specifically, the charge supply circuit 20 may supply charge from the terminal of the second power supply voltage VCCQ2 to the output node nd_O according to the voltage of the inverting output node nd_OB. The charge supply circuit 20 may supply charge from the terminal of the second power supply voltage VCCQ2 to the inverting output node nd_OB according to the voltage of the output node nd_OB.

The voltage adjustment circuit 30 may include a first voltage adjustment circuit 31, a second voltage adjustment circuit 33, a third voltage adjustment circuit 35, a first operation control circuit (FIRST OP CTR) 37a, and a second operation control circuit (SECOND OP CTR) 37b.

The first voltage adjustment circuit 31 may receive the bias voltage Vbias, and adjust a lower limit for the voltage levels of the output node nd_O and the inverting output node nd_OB to a higher level than the level of the bias voltage Vbias. Thus, the first voltage adjustment circuit 31 may alleviate the degradation of the charge supply circuit 20 coupled to the output node nd_O and the inverting output node nd_OB.

The second voltage adjustment circuit 33 may receive the first power supply voltage VCCQ1, and adjust an upper limit for the voltage levels of the internal node nd_Z and the inverting internal node nd_ZB to a lower level than the level of the first power supply voltage VCCQ1. Thus, the second voltage adjustment circuit 33 may alleviate the degradation of the discharge circuit 10 coupled to the internal node nd_Z and the inverting internal node nd_ZB.

The third voltage adjustment circuit 35 may include a MOS transistor (35_1 of FIG. 4) coupled between the internal node nd_X and the internal node nd_Y and a MOS transistor (35_2 of FIG. 4) coupled between the inverting internal node nd_XB and the inverting internal node nd_YB. The third voltage adjustment circuit 35 may adjust a voltage level applied to a gate terminal of the MOS transistor 35_1 to a level between the levels of the first and second power supply voltages VCCQ1 and VCCQ2, according to the voltage of the internal node nd_X. More specifically, the third voltage adjustment circuit 35 may adjust the voltage level applied to the gate terminal of the MOS transistor 35_1 to the level of the second power supply voltage VCCQ2, when the internal node nd_X is driven to the second power supply voltage VCCQ2. Thus, the third voltage adjustment circuit 35 may reduce the voltage difference across the MOS transistor 35_1 while the internal nodes nd_X and nd_Y are discharged, thereby alleviating the degradation of the MOS transistor 35_1. Furthermore, the third voltage adjustment circuit 35 may adjust the voltage level applied to the gate terminal of the MOS transistor 35_1 to the level of the first power supply voltage VCCQ1, when the internal node nd_X is to driven to the ground voltage VSS. Thus, the third voltage adjustment circuit 35 may alleviate the degradation of the MOS transistor 35_1, when the internal node nd_X is driven to the ground voltage VSS. Similarly, the third voltage adjustment circuit 35 may adjust a voltage level applied to a gate terminal of the MOS transistor 35_2 to a level between the levels of the first and second power supply voltages VCCQ1 and VCCQ2, according to the voltage of the inverting internal node nd_XB, thereby alleviating the degradation of the MOS transistor 35_2.

The first and second operation control circuits 37a and 37b may receive the detection voltage Vdet, and determine whether the levels of the first and second power supply voltages VCCQ1 and VCCQ2 are equal to each other. When the levels of the first and second power supply voltages VCCQ1 and VCCQ2 are equal to each other, the first operation control circuit 37a may control the first voltage adjustment circuit 31 to stop the operation of adjusting the lower limit for the voltage level of the output node nd_O on the basis of the bias voltage Vbias. Similarly, when the levels of the first and second power supply voltages VCCQ1 and VCCQ2 are equal to each other, the second operation control circuit 37b may control the first voltage adjustment circuit 31 to stop the operation of adjusting the lower limit for the voltage level of the inverting output node nd_OB on the basis of the bias voltage Vbias. Thus, when the first and second power supply voltages VCCQ1 and VCCQ2 having the same level are applied to the level shifter 100, the first and second operation control circuits 37a and 37b may control the level shifter 100 to stably buffer the input signal IN and to output the buffered signal as the output signal OUT.

The compensation current supply circuit 40 may continuously supply a compensation current to the output node nd_O and the inverting output node nd_OB in order to compensate for a leakage current of the first voltage adjustment circuit 31. Therefore, the compensation current supply circuit 40 may reduce a variation in the lower limit for the voltage levels of the output node nd_O and the inverting output node nd_OB due to the leakage current of the first voltage adjustment circuit 31.

The control current supply circuit 50 may detect the voltage of the input signal IN before the charge of the output node nd_O is released to the terminal of the ground voltage VSS, according to the voltage of the input signal IN, and supply a control current to the inverting output node nd_OB such that the charge supply circuit 20 stops the operation of supplying charge to the output node nd_O. Thus, the control current supply circuit 50 may detect the voltage of the input signal IN before a channel through which the charge of the output node nd_O is released is formed, according to the voltage of the input signal IN, and first block the channel through which the charge of the output node nd_O is supplied, thereby improving the duty ratio of the output signal OUT outputted from the output node nd_O.

FIG. 2 is a table for describing the levels of the voltages applied to the level shifter 100 illustrated in FIG. 1 in accordance with an embodiment of the present disclosure.

TABLE A in FIG. 2 represents a table for describing the case in which the first and second power supply voltages VCCQ1 and VCCQ2 having different levels are applied to the level shifter 100. The levels of the first power supply voltage VCCQ1, the second power supply voltage VCCQ2, and the ground voltage VSS may be set to 1.8 V, 3.3 V, and 0 V, respectively. The level of the bias voltage Vbias may be set to 1.38 V, when the first and second power supply voltages VCCQ1 and VCCQ2 have different levels. The level of the detection voltage Vdet may be set to 0 V when the first and second power supply voltages VCCQ1 and VCCQ2 have different levels.

TABLE B in FIG. 2 represents a table for describing the case in which the first and second power supply voltages VCCQ1 and VCCQ2 having the same level are applied to the level shifter 100. The levels of the first power supply voltage VCCQ1, the second power supply voltage VCCQ2, and the ground voltage VSS may be set to 1.8 V, 1.8 V, and 0 V, respectively. The level of the bias voltage Vbias may be set to 1.8 V when the first and second power supply voltages VCCQ1 and VCCQ2 have the same level. The level of the detection voltage Vdet may be set to 1.8 V when the first and second power supply voltages VCCQ1 and VCCQ2 have the same level.

Figure 3:
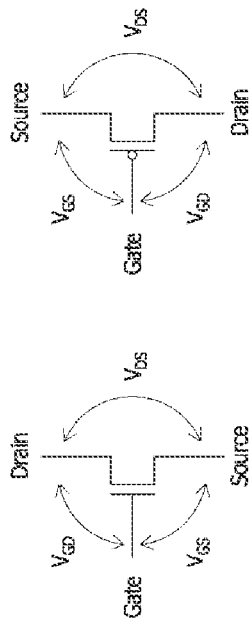
FIG. 3 is a diagram for describing a condition for alleviating the degradation of a MOS transistor included in the level shifter illustrated in FIG. 1 in accordance with an embodiment of the present disclosure.

FIG. 3 is a diagram for describing a condition for alleviating the degradation of a MOS transistor included in the level shifter 100 illustrated in FIG. 1 in accordance with an embodiment of the present disclosure. FIG. 3 shows that, only when a voltage difference VGD between the gate and drain terminals of the MOS transistor, a voltage difference VGS between the gate and source terminals of the MOS transistor, and a voltage difference VDS between the drain and source terminals of the MOS transistor are each set to 1.98 V or lower, the degradation of the MOS transistor can be alleviated.

Figure 4:
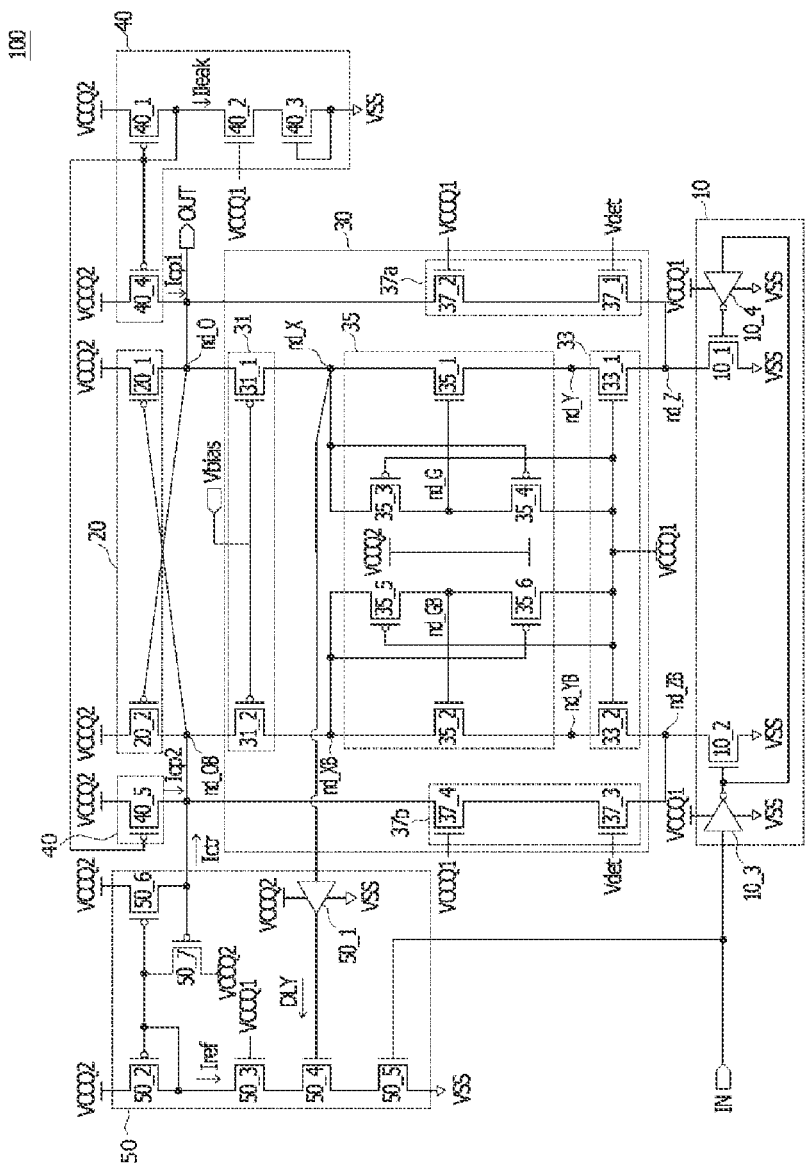
FIG. 4 is a circuit diagram illustrating an example of the level shifter illustrated in FIG. 1 in accordance with an embodiment of the present disclosure.

FIG. 4 is a circuit diagram illustrating an example of the level shifter 100 illustrated in FIG. 1 in accordance with an embodiment of the present disclosure. As illustrated in FIG. 4, the level shifter 100 may include a discharge circuit 10, a charge supply circuit 20, a voltage adjustment circuit 30, a compensation current supply circuit 40, and a control current supply circuit 50.

The discharge circuit 10 may include NMOS transistors 10_1 and 10_2 and driving circuits 10_3 and 10_4. The NMOS transistor 10_1 may be coupled between a terminal of a ground voltage VSS and an internal node nd_Z. The NMOS transistor 10_2 may be coupled between the terminal of the ground voltage VSS and an internal inverting node nd_ZB. The driving circuit 10_3 may invert and buffer an input signal IN on the basis of a first power supply voltage VCCQ1 and the ground voltage VSS, and output the inverted and buffered signal to a gate terminal of the NMOS transistor 10_2. The driving circuit 10_4 may invert and buffer the signal outputted from the driving circuit 10_3 on the basis of the first power supply voltage VCCQ1 and the ground voltage VSS, and output the inverted and buffered signal to a gate terminal of the NMOS transistor 10_1.

The discharge circuit 10 may receive the input signal IN on the basis of the first power supply voltage VCCQ1 and the ground voltage VSS, and discharge one of the internal node nd_Z and the inverting internal node nd_ZB to the terminal of the ground voltage VSS according to the voltage of the input signal IN. For example, when the input signal IN is inputted as the level of the first power supply voltage VCCQ1, the discharge circuit 10 may turn on the NMOS transistor 10_1 through the driving circuits 10_3 and 10_4, and thus discharge the internal node nd_Z to the terminal of the ground voltage VSS. On the other hand, when the input signal IN is inputted as the level of the ground voltage VSS, the discharge circuit 10 may turn on the NMOS transistor 10_2 through the driving circuit 10_3, and thus discharge the inverting internal node nd_ZB to the terminal of the ground voltage VSS.

The charge supply circuit 20 may include PMOS transistors 20_1 and 20_2. The PMOS transistor 20_1 may be coupled between a terminal of a second power supply voltage VCCQ2 and an output node nd_O, and have a gate terminal coupled to an inverting output node nd_OB. The PMOS transistor 20_2 may be coupled between the terminal of the second power supply voltage VCCQ2 and the inverting output node nd_OB, and have a gate terminal coupled to the output node nd_O.

The charge supply circuit 20 may supply charge to the output node nd_O and the inverting output node nd_OB on the basis of the second power supply voltage VCCQ2. More specifically, the charge supply circuit 20 may drive the output node nd_O to the second power supply voltage VCCQ2 according to the voltage of the inverting output node nd_OB, and drive the inverting output node nd_OB to the second power supply voltage VCCQ2 according to the voltage of the output node nd_O. For example, the charge supply circuit 20 may drive the output node nd_O to the second power supply voltage VCCQ2, when the inverting output node nd_OB is discharged according to the voltage of the input signal IN, and drive the inverting output node nd_OB to the second power supply voltage VCCQ2, when the output node nd_O is discharged according to the voltage of the input signal IN.

The voltage adjustment circuit 30 may include a first voltage adjustment circuit 31, a second voltage adjustment circuit 33, a third voltage adjustment circuit 35, a first operation control circuit 37a, and a second operation control circuit 37b.

The first voltage adjustment circuit 31 may include PMOS transistors 31_1 and 31_2 each having a gate terminal configured to receive a bias voltage Vbias. The PMOS transistor 31_1 may be coupled between the output node nd_O and an internal node nd_X, and the PMOS transistor 31_2 may be coupled between the inverting output node nd_OB and an inverting internal node nd_XB.

The first voltage adjustment circuit 31 may adjust the voltage level of the output node nd_O to a level equal to or higher than a level obtained by adding a threshold voltage of the PMOS transistor 31_1 to the level of the bias voltage Vbias, on the basis of the bias voltage Vbias applied to the gate terminal of the PMOS transistor 31_1. For example, when the bias voltage Vbias is 1.38 V and the threshold voltage of the PMOS transistor 31_1 is 0.32 V, the first voltage adjustment circuit 31 may adjust the voltage of the output node nd_O to 1.7 V or higher. This is because, when the voltage of the output node nd_O is lower than the level obtained by adding the threshold voltage of the PMOS transistor 31_1 to the level of the bias voltage Vbias, the PMOS transistor 31_1 operates in a cutoff region. Similarly, the first voltage adjustment circuit 31 may adjust the voltage level of the inverting output node nd_OB to a level equal to or higher than a level obtained by adding a threshold voltage of the PMOS transistor 31_2 to the level of the bias voltage Vbias, on the basis of the bias voltage Vbias applied to the PMOS transistor 31_2. Thus, the first voltage adjustment circuit 31 may adjust the lower limit for the voltage levels of the output node nd_O and the inverting output node nd_OB on the basis of the bias voltage Vbias, thereby alleviating the degradation of the PMOS transistors 20_1 and 20_2 included in the charge supply circuit 20.

The second voltage adjustment circuit 33 may include NMOS transistors 33_1 and 33_2 each having a gate terminal configured to receive the first power supply voltage VCCQ1. The NMOS transistor 33_1 may be coupled between an internal node nd_Z and an internal node nd_Y, and the NMOS transistor 33_2 may be coupled between an inverting internal node nd_ZB and an inverting internal node nd_YB.

The second voltage adjustment circuit 33 may adjust the voltage level of the internal node nd_Z to a level equal to or lower than a level obtained by subtracting a threshold voltage of the NMOS transistor 33_1 from the level of the first power supply voltage VCCQ1, on the basis of the first power supply voltage VCCQ1 applied to the gate terminal of the NMOS transistor 33_1. For example, when the first power supply voltage VCCQ1 is 1.8 V and the threshold voltage of the NMOS transistor 33_1 is 0.32 V, the second voltage adjustment circuit 33 may adjust the voltage of the internal node nd_Z to 1.48 V or lower. This is because, when the voltage of the internal node nd_Z is higher than a level obtained by subtracting the threshold voltage of the NMOS transistor 33_1 from the level of the first power supply voltage VCCQ1, the NMOS transistor 33_1 operates in a cutoff region. Similarly, the second voltage adjustment circuit 33 may adjust the voltage level of the inverting internal node nd_ZB to a level equal to or lower than a level obtained by subtracting a threshold voltage of the NMOS transistor 33_2 from the level of the first power supply voltage VCCQ1, on the basis of the first power supply voltage VCCQ1 applied to the NMOS transistor 33_2. Thus, the second voltage adjustment circuit 33 may adjust the upper limit for the voltage levels of the internal node nd_Z and the inverting internal node nd_ZB on the basis of the first power supply voltage VCCQ1, thereby alleviating the degradation of the NMOS transistors 10_1 and 10_2 included in the discharge circuit 10.

The third voltage adjustment circuit 35 may include NMOS transistors 35_1 and 35_2 and PMOS transistors 35_3 to 35_6. The NMOS transistor 35_1 may have a drain terminal coupled to the internal node nd_X, a source terminal coupled to the internal node nd_Y, and a gate terminal coupled to a control node nd_G. The NMOS transistor 35_2 may have a drain terminal coupled to the inverting internal node nd_XB, a source terminal coupled to the inverting internal node nd_YB, and a gate terminal coupled to an inverting control node nd_GB.

The third voltage adjustment circuit 35 may detect the voltage of the internal node nd_X through the PMOS transistors 35_3 and 35_4, and adjust the voltage level of the control node nd_G to a level between the levels of the first and second power supply voltages VCCQ1 and VCCQ2. The PMOS transistor 35_3 may be coupled between the internal node nd_X and the control node nd_G, and have a gate terminal configured to receive the first power supply voltage VCCQ1 and a body terminal configured to receive the second power supply voltage VCCQ2. The PMOS transistor 35_4 may be coupled between the terminal of the first power supply voltage VCCQ1 and the control node nd_G, and have a gate terminal coupled to the internal node nd_X and a body terminal configured to receive the second power supply voltage VCCQ2.

The third voltage adjustment circuit 35 may detect the voltage of the inverting internal node nd_XB through the PMOS transistors 35_5 and 35_6, and adjust the voltage level of the inverting control node nd_GB to a level between the levels of the first and second power supply voltages VCCQ1 and VCCQ2. The PMOS transistor 35_5 may be coupled between the inverting internal node nd_XB and the inverting control node nd_GB, and have a gate terminal configured to receive the first power supply voltage VCCQ1 and a body terminal configured to receive the second power supply voltage VCCQ2. The PMOS transistor 35_6 may be coupled between the terminal of the first power supply voltage VCCQ1 and the inverting control node nd_GB, and have a gate terminal coupled to the inverting internal node nd_XB and a body terminal configured to receive the second power supply voltage VCCQ2.

The third voltage adjustment circuit 35 may adjust the voltage level of the internal node nd_Y to a level equal to or lower than a level obtained by subtracting a threshold voltage of the NMOS transistor 35_1 from the level of the control node nd_G, on the basis of the voltage of the control node nd_G applied to the gate terminal of the NMOS transistor 35_1. For example, when the voltage of the control node nd_G is 3.3 V and the threshold voltage of the NMOS transistor 35_1 is 0.32 V, the third voltage adjustment circuit 35 may adjust the voltage of the internal node nd_Y to 2.98 V. Similarly, the third voltage adjustment circuit 35 may adjust the voltage level of the inverting internal node nd_YB to a level equal to or lower than a level obtained by subtracting a threshold voltage of the NMOS transistor 35_2 from the level of the inverting control node nd_G, on the basis of the voltage of the inverting control node nd_GB applied to the gate terminal of the NMOS transistor 35_2. Thus, the third voltage adjustment circuit 35 may adjust the upper limit for the voltage levels of the internal node nd_Y and the inverting internal node nd_YB, thereby alleviating the degradation of the NMOS transistors 33_1 and 33_2 included in the second voltage adjustment circuit 33.

When the internal node nd_X is driven to the second power supply voltage VCCQ2, the third voltage adjustment circuit 35 may adjust the voltage level of the control node nd_G to the level of the second power supply voltage VCCQ2 through the PMOS transistor 35_3. More specifically, when the voltage of the internal node nd_X is equal to or higher than a level obtained by adding a threshold voltage of the PMOS transistor 35_2 to the level of the first power supply voltage VCCQ1, the third voltage adjustment circuit 35 may turn on the PMOS transistor 35_3 to drive the control node nd_G to the voltage of the internal node nd_X, When the internal node nd_X is driven to the second power supply voltage VCCQ2, the third voltage adjustment circuit 35 may adjust the voltage level of the control node nd_G to the level of the second power supply voltage VCCQ2, and thus reduce the voltage difference between the internal nodes nd_X and nd_Y while the charges of the internal nodes nd_X and nd_Y are discharged to the terminal of the ground voltage VSS. This is because, the larger the voltage difference between the control node nd_G and the internal node nd_Y, the more the drain current of the NMOS transistor 35_1. Similarly, when the inverting internal node nd_XB is driven to the second power supply voltage VCCQ2, the third voltage adjustment circuit 35 may adjust the voltage level of the inverting control node nd_GB to the level of the second power supply voltage VCCQ2, and thus reduce the voltage difference between the inverting internal nodes nd_XB and nd_YB while the charges of the inverting internal nodes nd_XB and nd_YB are released to the terminal of the ground voltage VSS. Thus, the third voltage adjustment circuit 35 may alleviate the degradation of the NMOS transistor 35_1 while the charges of the internal nodes nd_X and nd_Y are released, and alleviate the degradation of the NMOS transistor 35_2 while the charges of the inverting internal nodes nd_XB and nd_YB are released.

When the internal node nd_X is driven to the ground voltage VSS, the third voltage adjustment circuit 35 may adjust the voltage level of the control node nd_G to the level of the first power supply voltage VCCQ1 through the PMOS transistor 35_4. More specifically, when the voltage of the internal node nd_X is equal to or lower than a level obtained by subtracting a threshold voltage of the PMOS transistor 35_4 from the level of the first power supply voltage VCCQ1, the third voltage adjustment circuit 35 may turn on the PMOS transistor 35_4 to drive the control node nd_G to the first power supply voltage VCCQ1. Similarly, when the inverting internal node nd_XB is driven to the ground voltage VSS, the third voltage adjustment circuit 35 may adjust the voltage level of the inverting control node nd_GB to the level of the first power supply voltage VCCQ1 through the PMOS transistor 35_6. Thus, the third voltage adjustment circuit 35 may alleviate the degradation of the NMOS transistor 35_1 when the internal nodes nd_X and nd_Y are driven to the ground voltage VSS, and alleviate the degradation of the NMOS transistor 35_2 while the inverting internal nodes nd_XB and nd_YB are driven to the ground voltage VSS.

The first operation control circuit 37a may include NMOS transistors 37_1 and 37_2 coupled in parallel to the PMOS transistor 31_1 and the NMOS transistors 33_1 and 35_1 between the output node nd_O and the internal node nd_Z. The NMOS transistor 37_1 may have a gate terminal configured to receive a detection voltage Vdet. The level of the detection voltage Vdet may be set differently depending on whether the levels of the first and second power supply voltages VCCQ1 and VCCQ2 are equal to each other. The first operation control circuit 37a may turn on the NMOS transistor 37_1 according to the level of the detection voltage Vdet, and thus control the first voltage adjustment circuit 31 to stop the operation of adjusting the lower limit for the voltage level of the output node nd_O on the basis of the bias voltage Vbias. The NMOS transistor 37_2 may be coupled between the output node nd_O and the NMOS transistor 37_1. The NMOS transistor 37_2 may receive the first power supply voltage VCCQ1 through a gate terminal thereof, thereby alleviating the degradation of the NMOS transistor 37_1.

The second operation control circuit 37b may include NMOS transistors 37_3 and 37_4 coupled in parallel to the PMOS transistor 31_2 and the NMOS transistors 33_2 and 35_2 between the inverting output node nd_OB and the inverting internal node nd_ZB. The NMOS transistor 37_3 may have a gate terminal configured to receive the detection voltage Vdet. The second operation control circuit 37b may turn on the NMOS transistor 37_3 according to the level of the detection voltage Vdet, and thus control the first voltage adjustment circuit 31 to stop the operation of adjusting the lower limit for the level of the inverting output node nd_OB on the basis of the bias voltage Vbias. The NMOS transistor 37_4 may be coupled between the inverting output node nd_OB and the NMOS transistor 37_3. The NMOS transistor 37_4 may receive the first power supply voltage VCCQ1 through a gate terminal thereof, thereby alleviating the degradation of the NMOS transistor 37_3.

Thus, when the first and second power supply voltages VCCQ1 and VCCQ2 having the same level are applied to the level shifter 100, the first and second operation control circuits 37a and 37b may control the level shifter 100 to stably buffer the input signal IN and to output the buffered signal as the output signal OUT.

The compensation current supply circuit 40 may include PMOS transistors 40_1, 40_4, and 40_5 and NMOS transistors 40_2 and 40_3. The compensation current supply circuit 40 may receive the first power supply voltage VCCQ1, the second power supply voltage VCCQ2, and the ground voltage VSS, and supply a first compensation current Icp1 to the output node nd_O and supply a second compensation current Icp2 to the inverting output node nd_OB. More specifically, the compensation current supply circuit 40 may generate a leakage current Ileak on the basis of the NMOS transistor 40_3 which operates in a cutoff region. The compensation current supply circuit 40 may mirror the leakage current Ileak, and supply the mirrored current as the first compensation current Icp1 to the output node nd_O. The first compensation current Icp1 may be generated to compensate for the leakage current of the PMOS transistor 31_1 which adjusts the lower limit for the voltage level of the output node nd_O on the basis of the bias voltage Vbias. The compensation current supply circuit 40 may mirror the leakage current Ileak, and supply the mirrored current as the second compensation current Icp2 to the inverting output node nd_OB. The second compensation current Icp2 may be generated to compensate for the leakage current of the PMOS transistor 31_2 which adjusts the lower limit for the voltage level of the inverting output node nd_OB on the basis of the bias voltage Vbias.

The PMOS transistor 40_1, the NMOS transistor 40_2, and the NMOS transistor 40_3 may be coupled in series between the terminal of the second power supply voltage VCCQ2 and the terminal of the ground voltage VSS, and generate the leakage current Ileak. The PMOS transistor 40_1 may have gate and drain terminals coupled to each other, and operate in a saturation region. The NMOS transistor 40_2 may receive the first power supply voltage VCCQ1 through a gate terminal thereof, thereby alleviating the degradation of the PMOS transistor 40_1 and the NMOS transistor 40_3. The NMOS transistor 40_3 may have gate and source terminals coupled to the terminal of the ground voltage VSS, and operate in a cutoff region.

The PMOS transistor 40_4 may mirror the leakage current Ileak, and supply the mirrored current as the first compensation current Icp1 to the output node nd_O. The PMOS transistor 40_4 may be coupled between the terminal of the second power supply voltage VCCQ2 and the output node nd_O, and have a gate terminal coupled to the gate terminal of the PMOS transistor 40_1. The ratio of the leakage current Ileak to the first compensation current Icp1 may be set to various values by the gate widths and lengths of the PMOS transistors 40_1 and 40_4.

The PMOS transistor 40_5 may mirror the leakage current Ileak, and supply the mirrored current as the second compensation current Icp2 to the inverting output node nd_OB. The PMOS transistor 40_5 may be coupled between the terminal of the second power supply voltage VCCQ2 and the inverting output node nd_OB, and have a gate terminal coupled to the gate terminal of the PMOS transistor 40_1. The ratio of the leakage current Ileak to the second compensation current Icp2 may be set to various values by the gate widths and lengths of the PMOS transistors 40_1 and 40_5.

Therefore, the compensation current supply circuit 40 may continuously supply the compensation current to the output node nd_O and the inverting output node nd_OB, thereby reducing a variation in the lower limit for the voltage levels of the output node nd_O and the inverting output node nd_OB due to the leakage current of the first voltage adjustment circuit 31.

The control current supply circuit 50 may include a delay circuit 50_1, PMOS transistors 50_2, 50_6, and 50_7, and NMOS transistors 50_3, 50_4, and 50_5. The control current supply circuit 50 may receive the first power supply voltage VCCQ1, the second power supply voltage VCCQ2, and the ground voltage VSS, and supply a control current Ictr to the inverting output node nd_OB according to the input signal IN and the voltage of the internal node nd_X. The control current Ictr may be generated to control the operation of the charge supply circuit 20 to supply charge to the output node nd_O. More specifically, the control current supply circuit 50 may detect the voltage of the input signal IN, and supply the control current Ictr to the inverting output node nd_OB such that the charge supply circuit 20 stops the operation of supplying charge to the output node nd_O. For example, when the voltage of the input signal IN rises from the level of the ground voltage VSS to the level of the first power supply voltage VCCQ1, the control current supply circuit 50 may supply the control current Ictr to the inverting output node nd_OB in order to turn off the PMOS transistor 20_1 included in the charge supply circuit 20. The control current supply circuit 50 may detect the voltage of the internal node nd_X, and block the supply of the control current Ictr to the inverting output node nd_OB. For example, when the internal node nd_X is driven to the ground voltage VSS as the voltage of the input signal IN rises from the level of the ground voltage VSS to the level of the first power supply voltage VCCQ1, the control current supply circuit 50 may block the supply of the control current Ictr to the inverting output node nd_OB.

The delay circuit 50_1 may generate a delayed signal DLY by buffering the signal of the internal node nd_X on the basis of the second power supply voltage VCCQ2 and the ground voltage VSS.

The PMOS transistor 50_2, the NMOS transistor 50_3, the NMOS transistor 50_4, and the NMOS transistor 50_5 may be coupled in series between the terminal of the second power supply voltage VCCQ2 and the terminal of the ground voltage VSS, and generate a reference current Iref. The PMOS transistor 50_2 may have gate and drain terminals coupled to each other, and operate in a saturation region. The NMOS transistor 50_3 may receive the first power supply voltage VCCQ1 through a gate terminal thereof, thereby alleviating the degradation of the PMOS transistor 50_2 and the NMOS transistor 50_4. The NMOS transistor 50_4 may be turned on according to the voltage of the delayed signal DLY. The NMOS transistor 50_5 may be turned on according to the voltage of the input signal IN.

The PMOS transistor 50_6 may mirror the reference current Iref, and supply the mirrored current as the control current Ictr to the inverting output node nd_OB. The PMOS transistor 50_6 may be coupled between the terminal of the second power supply voltage VCCQ2 and the inverting output node nd_OB, and have a gate terminal coupled to the gate terminal of the PMOS transistor 50_2. The ratio of the reference current Iref to the control current Ictr may be set to various values by the gate widths and lengths of the PMOS transistors 50_2 and 50_6.

The PMOS transistor 50_7 may apply the second power supply voltage VCCQ2 to the gate terminals of the PMOS transistors 50_2 and 50_6 according to the voltage of the inverting output node nd_OB, thereby turning off the PMOS transistors 50_2 and 50_6. The PMOS transistor 50_7 may be coupled between the terminal of the second power supply voltage VCCQ2 and the gate terminals of the PMOS transistors 50_2 and 50_6, and have a gate terminal coupled to the inverting output node nd_OB.

Thus, the control current supply circuit 50 may detect the voltage of the input signal IN before a channel through which the charge of the output node nd_O is released is formed, according to the voltage of the input signal IN, and first block the channel through which the charge of the output node nd_O is supplied, thereby improving the duty ratio of the output signal OUT outputted from the output node nd_O.

Figure 5:
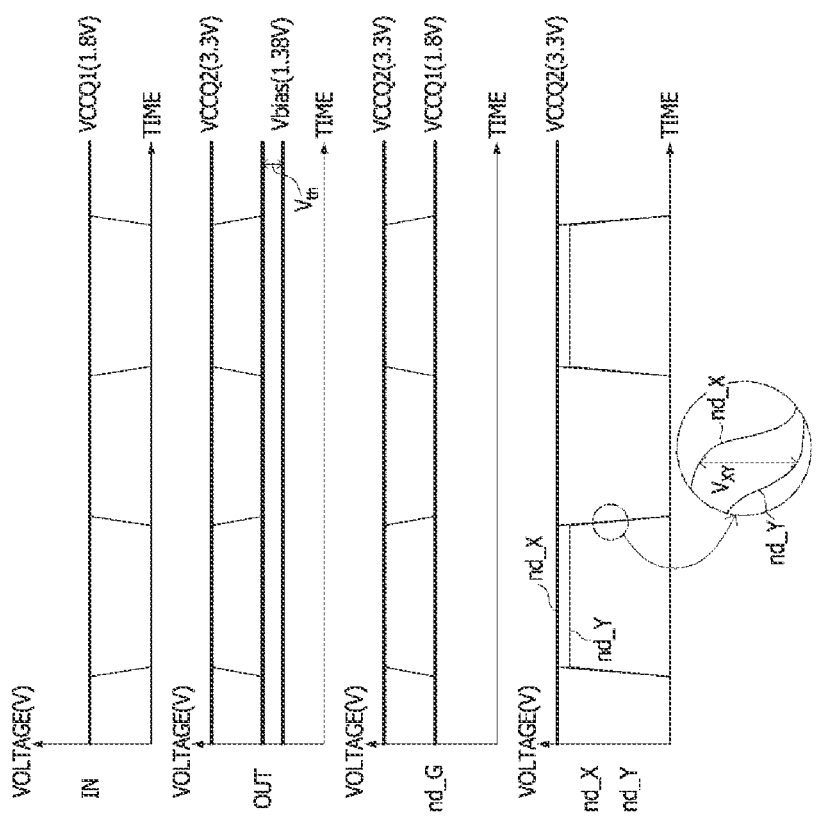
FIG. 5 is a graph for describing an operation of the level shifter when power supply voltages having different levels are applied to the level shifter illustrated in FIG. 4 in accordance with an embodiment of the present disclosure.

FIG. 5 is a graph for describing the operation of the level shifter 100 when the first and second power supply voltages VCCQ1 and VCCQ2 having different levels are applied to the level shifter 100 illustrated in FIG. 4 in accordance with an embodiment of the present disclosure. The levels of the first power supply voltage VCCQ1 and the second power supply voltage VCCQ2 may be set to 1.8 V and 3.3 V, respectively. The level of the bias voltage Vbias may be set to 1.38 V.

When the voltage of the input signal IN drops from the level of the first power supply voltage VCCQ1 to the level of the ground voltage VSS, the discharge circuit 10 may turn on the NMOS transistor 10_2 such that the charge of the inverting internal node nd_ZB is released to the terminal of the ground voltage VSS. When the charge of the inverting internal node nd_ZB is released, the voltage adjustment circuit 30 may turn on the NMOS transistors 33_2 and 35_2, such that the charge of the inverting internal node nd_XB is released to the inverting internal node nd_ZB, When the charge of the inverting internal node nd_XB is released, the voltage adjustment circuit 30 may adjust the voltage level of the inverting output node nd_OB to a level obtained by adding the threshold voltage of the PMOS transistor 31_2 to the level of the bias voltage Vbias, on the basis of the bias voltage Vbias. The compensation current supply circuit 40 may supply the second compensation current Icp2 to the inverting output node nd_OB such that the voltage of the inverting output node nd_OB retains a level obtained by adding the threshold voltage of the PMOS transistor 31_2 to the level of the bias voltage Vbias.

The charge supply circuit 20 may drive the output node nd_O, from which the output signal OUT is outputted, to the second power supply voltage VCCQ2 according to the voltage of the inverting output node nd_OB. The internal node nd_X may be driven to the second power supply voltage VCCQ2 when the output node nd_O is driven to the second power supply voltage VCCQ2. When the internal node nd_X is driven to the second power supply voltage VCCQ2, the voltage adjustment circuit 30 may adjust the voltage level of the control node nd_G, to which the gate terminal of the NMOS transistor 35_1 is coupled, to the level of the second power supply voltage VCCQ2.

When the voltage of the input signal IN rises from the level of the ground voltage VSS to the level of the first power supply voltage VCCQ1, the control current supply circuit 50 may supply the control current Ictr to the inverting output node nd_OB such that the charge supply circuit 20 stops the operation of supplying charge to the output node nd_O.

When the voltage of the input signal IN rises from the level of the ground voltage VSS to the level of the first power supply voltage VCCQ1, the discharge circuit 10 may turn on the NMOS transistor 10_1 such that the charge of the internal node nd_Z is released to the terminal of the ground voltage VSS. When the charge of the internal node nd_Z is released, the voltage adjustment circuit 30 may turn on the NMOS transistor 33_1, such that the charge of the internal node nd_Y is released to the internal node nd_Z. The voltage adjustment circuit 30 may turn on the NMOS transistor 35_1 when the charge of the internal node nd_Y is released. The voltage adjustment circuit 30 may increase a drain current of the NMOS transistor 35_1 on the basis of the voltage of the control node nd_G, which has been adjusted to the level of the second power supply voltage VCCQ2, thereby reducing a voltage difference VXY between the internal node nd_X and the internal node nd_Y. When the internal node nd_X is driven to the ground voltage VSS, the voltage adjustment circuit 30 may adjust the voltage level of the control node nd_G, to which the gate terminal of the NMOS transistor 35_1 is coupled, to the level of the first power supply voltage VCCQ1.

When the charge of the internal node nd_X is released, the voltage adjustment circuit 30 may adjust the voltage level of the output node nd_O to a level obtained by adding a threshold voltage Vth of the PMOS transistor 31_1 to the level of the bias voltage Vbias. The compensation current supply circuit 40 may supply the first compensation current Icp1 to the output node nd_O such that the voltage of the output node nd_O retains the level obtained by adding the threshold voltage Vth of the PMOS transistor 31_1 to the level of the bias voltage Vbias.

Figure 6:
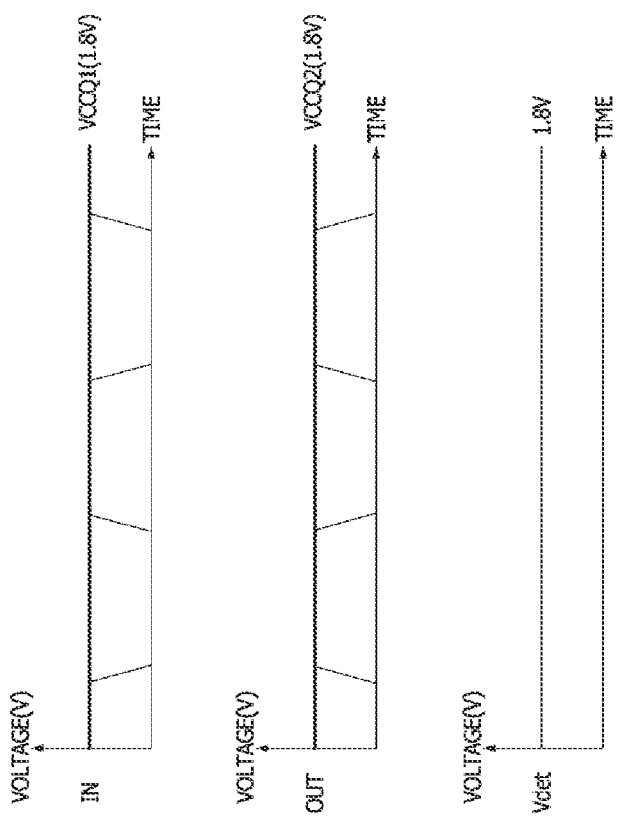
FIG. 6 is a graph for describing an operation of the level shifter when power supply voltages having the same level are applied to the level shifter illustrated in FIG. 4 in accordance with an embodiment of the present disclosure.

FIG. 6 is a graph for describing the operation of the level shifter 100 when the first and second power supply voltages VCCQ1 and VCCQ2 having the same level are applied to the level shifter 100 illustrated in FIG. 4 in accordance with an embodiment of the present disclosure. The levels of the first power supply voltage VCCQ1 and the second power supply voltage VCCQ2 may be equally set to 1.8 V. The level of the detection voltage Vdet may be set to 1.8 V when the first and second power supply voltages VCCQ1 and VCCQ2 have the same level.

When the voltage of the input signal IN drops from the level of the first power supply voltage VCCQ1 to the level of the ground voltage VSS, the discharge circuit 10 may turn on the NMOS transistor 10_2 such that the charge of the inverting internal node nd_ZB is released to the terminal of the ground voltage VSS. When the charge of the inverting internal node nd_ZB is released, the voltage adjustment circuit 30 may turn on the NMOS transistors 37_3 and 37_4 according to the level of the detection voltage Vdet, such that the charge of the inverting output node nd_OB is released to the inverting internal node nd_ZB. The charge supply circuit 20 may drive the output node nd_O to the second power supply voltage VCCQ2 according to the voltage of the inverting output node nd_OB.

When the voltage of the input signal IN rises from the level of the ground voltage VSS to the level of the first power supply voltage VCCQ1, the discharge circuit 10 may turn on the NMOS transistor 10_1 such that the charge of the internal node nd_Z is discharged. When the charge of the internal node nd_Z is released, the voltage adjustment circuit 30 may turn on the NMOS transistors 37_1 and 37_2 according to the level of the detection voltage Vdet, such that the charge of the output node nd_O is released to the internal node nd_Z.

Figure 7:
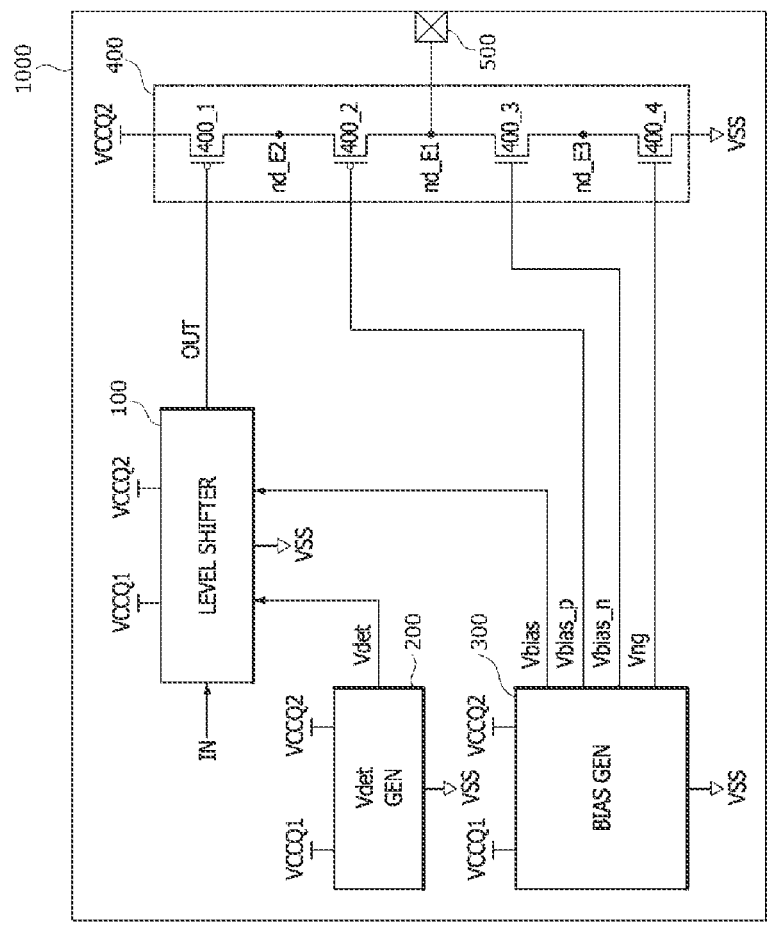
FIG. 7 is a diagram illustrating an example of an electronic device to which the level shifter illustrated in FIG. 1 is applied, in accordance with an embodiment of the present disclosure.

FIG. 7 is a diagram illustrating an example of an electronic device 1000 to which the level shifter 100 illustrated in FIG. 1 is applied. As illustrated in FIG. 7, the electronic device 1000 may include a level shifter 100, a detection voltage generation circuit (Vdet GEN) 200, a bias generation circuit (BIAS GEN) 300, and a driving circuit 400. The electronic device 1000 may receive a first power supply voltage VCCQ1, a second power supply voltage VCCQ2, and a ground voltage VSS from power supply pads (not illustrated).

The level shifter 100 may adjust the voltage level of an input signal IN on the basis of the first power supply voltage VCCQ1, the second power supply voltage VCCQ2, a bias voltage Vbias, a detection voltage Vdet, and the ground voltage VSS, and output the adjusted signal as an output signal OUT.

The detection voltage generation circuit 200 may receive the first power supply voltage VCCQ1, the second power supply voltage VCCQ2, and the ground voltage VSS, and generate the detection voltage Vdet. The detection voltage generation circuit 200 may differently set the level of the detection voltage Vdet, depending on whether the levels of the first and second power supply voltages VCCQ1 and VCCQ2 are equal to each other.

The bias generation circuit 300 may receive the first power supply voltage VCCQ1, the second power supply voltage VCCQ2, and the ground voltage VSS, and generate the bias voltage Vbias, a first interface bias voltage Vbias_p, a second interface bias voltage Vbias_n, and a negative bias voltage Vng. The levels of the bias voltage Vbias, the first interface bias voltage Vbias_p, the second interface bias voltage Vbias_n, and the negative bias voltage Vng may be set to various levels in different embodiments.

The driving circuit 400 may include PMOS transistors 400_1 and 400_2 and NMOS transistors 400_3 and 400_4 which are coupled in series between a terminal of the second power supply voltage VCCQ2 and a terminal of the ground voltage VSS. The driving circuit 400 may drive a node nd_E1 coupled to a pad 500 according to the voltage of the output signal OUT on the basis of the first interface bias voltage Vbias_p, the second interface bias voltage Vbias_n, and the negative bias voltage Vng. The PMOS transistor 400_1 may be coupled between the terminal of the second power supply voltage VCCQ2 and a node nd_E2, and receive the output signal OUT through a gate terminal thereof. The PMOS transistor 400_2 may be coupled between the node nd_E1 and the node nd_E2, and receive the first interface bias voltage Vbias_p through a gate terminal thereof. The NMOS transistor 400_3 may be coupled between the node nd_E1 and a node nd_E3, and receive the second interface bias voltage Vbias_n through a gate terminal thereof. The NMOS transistor 400_4 may be coupled between the node nd_E3 and the terminal of the ground voltage VSS, and receive the negative bias voltage Vng through a gate terminal thereof.

Although embodiments of the present disclosure have been disclosed for illustrative purposes, those skilled in the art will appreciate that various modifications, additions and substitutions are possible, without departing from the scope and spirit of the invention as defined in the accompanying claims. Furthermore, the embodiments may be combined to form additional embodiments.

What is claimed is:

1. A level shifter comprising:
   a discharge circuit configured to receive an input signal on the basis of a first power supply voltage and discharge an internal node on the basis of the input signal;
   a charge supply circuit configured to supply charge to an output node from which an output signal is outputted, on the basis of a second power supply voltage; and
   a voltage adjustment circuit comprising a first MOS transistor coupled between the internal node and the output node, and configured to:
      adjust a voltage level of the output node on the basis of a bias voltage applied to the first MOS transistor, and
      stop the adjusting of the voltage level of the output node when levels of the first and second power supply voltages are equal to each other.

2. The level shifter of claim 1, wherein the voltage adjustment circuit is configured to adjust the voltage level of the output node to a level equal to or higher than a level obtained by adding a threshold voltage of the first MOS transistor to a level of the bias voltage.

3. The level shifter of claim 2, wherein the first MOS transistor is a PMOS transistor having a gate terminal configured to receive the bias voltage.

4. The level shifter of claim 1,
   wherein the voltage adjustment circuit further comprises a second MOS transistor coupled in parallel with the first MOS transistor between the internal node and the output node, and having a gate terminal configured to receive a detection voltage, and
   wherein a level of the detection voltage is set differently depending on whether the levels of the first and second power supply voltages are equal to each other.

5. The level shifter of claim 1, further comprising a compensation current supply circuit comprising a third MOS transistor configured to operate in a cutoff region, the compensation current supply circuit being configured to generate a leakage current through the third MOS transistor and mirror the leakage current to supply the mirrored current as a compensation current to the output node.

6. The level shifter of claim 1,
   wherein the discharge circuit is configured to discharge one of the internal node and an inverting internal node according to a voltage level of the input signal,
   wherein the charge supply circuit is configured to supply charge to the output node on the basis of the second power supply voltage according to a voltage level of an inverting output node,
   wherein the voltage adjustment circuit further comprises a fourth MOS transistor coupled between the inverting internal node and the inverting output node, and
   wherein the voltage adjustment circuit is further configured to adjust a voltage level of the inverting output node to a level equal to or higher than a level obtained by adding a threshold voltage of the fourth MOS transistor to a level of the bias voltage, which is applied to a gate terminal of the fourth MOS transistor.

7. The level shifter of claim 6, wherein the voltage adjustment circuit is further configured to stop the adjusting of the voltage level of the inverting output node when the levels of the first and second power supply voltages are equal to each other.

8. The level shifter of claim 6, further comprising a control current supply circuit configured to detect the voltage level of the input signal and supply a control current to the inverting output node,
   wherein the charge supply circuit is further configured to stop, according to the control current, the supplying of the charge to the output node.

9. The level shifter of claim 1,
   wherein the voltage adjustment circuit further comprises a fifth MOS transistor coupled between the first MOS transistor and the internal node, and
   wherein the voltage adjustment circuit is further configured to adjust a voltage level of the internal node to a level equal to or lower than a level obtained by subtracting a threshold voltage of the fifth MOS transistor from the level of the first power supply voltage, which is applied to a gate terminal of the fifth MOS transistor.

10. A level shifter comprising:
    a discharge circuit configured to receive an input signal on the basis of a first power supply voltage and discharge a charge of an internal node on the basis of the input signal;
    a charge supply circuit configured to supply charge to an output node from which an output signal is outputted, on the basis of a second power supply voltage; and
    a voltage adjustment circuit comprising a first MOS transistor coupled between the internal node and the output node, and configured to:
       detect a voltage level of one terminal of the first MOS transistor coupled to the output node, and
       adjust a voltage level of a gate terminal of the first MOS transistor to a level between a level of the first power supply voltage and a level of the second power supply voltage,
    wherein the voltage adjustment circuit is further configured to adjust, when the one terminal of the first MOS transistor is driven to the second power supply voltage, a voltage level of a control node, to which the gate terminal of the first MOS transistor is coupled, to a level of the second power supply voltage.

11. The level shifter of claim 10, wherein the voltage adjustment circuit is configured to adjust, when detecting the voltage level of the one terminal of the first MOS transistor, the voltage level of the gate terminal of the first MOS transistor to a level between levels of the first and second power supply voltages.

12. The level shifter of claim 10, wherein the voltage adjustment circuit further comprises a second MOS transistor coupled between the one terminal of the first MOS transistor and the control node and having a gate terminal configured to receive the first power supply voltage.

13. The level shifter of claim 10, wherein the voltage adjustment circuit is further configured to adjust, when the one terminal of the first MOS transistor is driven to a ground voltage, the voltage level of the control node to a level of the first power supply voltage.

14. The level shifter of claim 13, wherein the voltage adjustment circuit further comprises a third MOS transistor coupled between a terminal of the first power supply voltage and the control node and having a gate terminal coupled to the one terminal of the first MOS transistor.

15. The level shifter of claim 13, wherein the discharge circuit is configured to discharge the charge of the internal node to a terminal of the ground voltage according to a voltage level of the input signal.

16. The level shifter of claim 10,
wherein the discharge circuit is configured to discharge one of the internal node and an inverting internal node according to a voltage level of the input signal,
wherein the charge supply circuit is configured to supply charge to the output node on the basis of the second power supply voltage according to a voltage level of an inverting output node,
wherein the voltage adjustment circuit further comprises a fourth MOS transistor coupled between the inverting internal node and the inverting output node, and
wherein the voltage adjustment circuit is further configured to detect a voltage level of one terminal of the fourth MOS transistor coupled to the inverting output node and adjust a voltage level of a gate terminal of the fourth MOS transistor.

17. The level shifter of claim 16, wherein the voltage adjustment circuit is further configured to:
adjust a voltage level of an inverting control node, to which the gate terminal of the fourth MOS transistor is coupled, to a level of the second power supply voltage when the one terminal of the fourth MOS transistor is driven to the second power supply voltage, and
adjust the voltage level of the inverting control node to a level of the first power supply voltage when the one terminal of the fourth MOS transistor is driven to a ground voltage.

18. The level shifter of claim 10,
wherein the voltage adjustment circuit further comprises a fifth MOS transistor coupled between the internal node and the first MOS transistor, and
wherein the voltage adjustment circuit is further configured to adjust a voltage level of the internal node to a level equal to or lower than a level obtained by subtracting a threshold voltage of the fifth MOS transistor from a level of the first power supply voltage, which is applied to a gate terminal of the fifth MOS transistor.

19. The level shifter of claim 10,
wherein the voltage adjustment circuit further comprises a sixth MOS transistor coupled between the output node and the first MOS transistor, and
wherein the voltage adjustment circuit is further configured to adjust a voltage level of the output node to a level equal to or higher than a level obtained by adding a threshold voltage of the sixth MOS transistor to a level of a bias voltage, which is applied to a gate terminal of the sixth MOS transistor.

20. A level shifter comprising:
a first circuit configured to discharge an internal node according to an input signal and charge an output node, through which an output signal is output:
a second circuit coupled to the output node and configured to adjust a lower limit for the voltage level of the output node according to levels of a bias voltage;
a third circuit coupled to the internal node and configured to adjust an upper limit for the voltage level of the internal node according to a first power supply voltage; and
a fourth circuit configured to adjust a gate voltage level of a transistor to a level between a level of the first power supply voltage and a level of a second power supply voltage, which is coupled between the second and third circuits, according to a voltage level of a node between the second circuit and the transistor,
wherein levels of the input and output signals depend on the first and second power supply voltages, respectively, and
wherein the fourth circuit is further configured to adjust, when the one terminal of the transistor is driven to the second power supply voltage, a voltage level of a control node, to which the gate terminal of the transistor is coupled, to a level of the second power supply voltage.

* * * * *